US006452417B1

(12) United States Patent
Moore (10) Patent No.: US 6,452,417 B1
(45) Date of Patent: Sep. 17, 2002

(54) I/O CELL ARCHITECTURE FOR CPLDS

(75) Inventor: Michael T. Moore, Santa Clara, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 09/834,219

(22) Filed: Apr. 12, 2001

(51) Int. Cl.$^7$ ................................................. G06F 7/38

(52) U.S. Cl. ................................. 326/41; 326/39

(58) Field of Search ............................. 326/38, 39, 41

(56) References Cited

U.S. PATENT DOCUMENTS 5,231,312 A * 7/1993 Gongwer et al. ............ 307/465
5,850,151 A * 12/1998 Cliff et al. .................... 326/39
6,034,541 A * 3/2000 Kopec, Jr. et al. ............ 326/39

OTHER PUBLICATIONS

"Hybrid Product Term and Lut Based Architectures Using Embedded Memory Blocks", By Frank Heile and Andrew Leaver, International Symposium on Field Programmable Gate Arrays, Feb. 21–23, 1999, pp. 13–16.
"An Innovative, Segmented High Performance FPGA Family with Variable–Grain–Architecture and Wide–Gating Functions", By Om Agrawal et al., International Symposium on Field Programmable Gate Arrays, Feb. 21–23, 1999, pp. 17–26.
"A New High Density and Very Low Cost Reprogrammable FPGA Architecture", By Sinan Kaptanoglu et al., International Symposium on Field Programmable Gate Arrays, Feb. 21–23, 1999, pp. 3–12.
"XC4000E and XC4000X Series Field Programmable Gate Arrays", XILINX, May 14, 1996 (Version 1.6), pp. 6–5 to 6–72.

"XC4000XLA/XV Field Programmable Gate Arrays", XILINX, Oct. 18, 1999, pp. 6–157 to 6–170.
"Virtex™ 2.5V Field Programmable Gate Arrays", XILINX, Apr. 2, 2001, pp. 1–20.
"Coolrunner® XPLA3 CPLD", XILINX, Apr. 11, 2001, pp. 1–10.
"Spartan and Spartan–XL Families Field Programmable Gate Arrays", XILINX, Mar. 2, 2000, pp. 4–1 to 4–66.
"XC9500XV Family High–Performance CPLD", XILINX, Jan. 15, 2001, pp. 1–18.
"Integrated Product–Term Logic in Apex 20K Devices", Altera, Apr. 1999, ver. 1.0, pp. 1–12.
"Apex II Programmable Logic Device Family", Altera, May 2001, ver. 1.1, pp. 1–96.
"Flex 10K Embedded Programmable Logic Device Family", Altera, Mar. 2001, ver. 4.1, pp. 1–128.
"Max 7000 Programmable Logic Device Family", Altera, Mar. 2001, ver. 6.1, pp. 1–62.
"Flex 8000 Programmable Logic Device Family", Altera, Jun., 1999, ver. 10.01, pp. 349–410.

(List continued on next page.)

Primary Examiner—Michael Tokar
Assistant Examiner—Anh Q. Tran
(74) Attorney, Agent, or Firm—Christopher P. Malorana, P.C.

(57) ABSTRACT

An I/O cell of a programmable logic device comprising a register, a first multiplexer, a second multiplexer, and a third multiplexer. The first multiplexer may be configured to present one of a plurality of signals to a data input of the register in response to a control signal. The second multiplexer may be configured to select either an output signal from the register or an external input signal in response to the control signal. The third multiplexer may be configured to select one of a number of inputs for presentation as an output signal of the I/O cell in response to the control signal. The register may be configured as an internal register of the programmable logic device when the I/O cell is configured to receive a combinatorial input signal and/or present a combinatorial output signal.

18 Claims, 5 Drawing Sheets

OTHER PUBLICATIONS

"Max 9000 Programmable Logic Device Family", Altera, Jul. 1999, ver. 6.01, pp. 1–40.

"Mach 5 CPLD Family—Fifth Generation Mach Architecture", Lattice Semiconductor Corp., Rev. 1, Sep. 2000, p. 1–47.

Timothy M. Lacey et al., "Programmable Logic Device", U.S. Ser. No. 09/475,879, Filed Dec. 30, 1999.

Rajesh Manapat et al., "Dual Port SRAM", U.S. Ser. No. 09/633,514, Filed Aug. 7, 2000.

Timothy M. Lacey et al., "I/O Architecture/Cell Design for Programmable Logic Device", U.S. Ser. No. 09/539,943, Filed Mar. 31, 2000.

* cited by examiner

I/O CELL ARCHITECTURE FOR CPLDS

CROSS-REFERENCE TO RELATED APPLICATIONS

The present invention may relate to co-pending applications U.S. Ser. No. 09/475,879, filed Dec. 30, 1999 and U.S. Ser. No. 09/539,943, filed Mar. 31, 2000, which are each hereby incorporated by reference in their entirety.

FIELD OF THE INVENTION

The present invention relates to a method and/or architecture for complex programmable logic devices (CPLDs) generally and, more particularly, to a method and/or architecture for implementing internal registers using I/O cells of CPLDs.

BACKGROUND OF THE INVENTION

Complex programmable logic devices (CPLDs) can have I/O cells that contain I/O registers and macrocells that contain macrocell registers. The I/O cells can be configured to provide either registered or combinatorial input/output signals to the I/O pins. When the I/O cells are configured to provide registered signals, a register in each I/O cell is configured to provide either a registered input or a registered output. When the I/O cells are configured as combinatorial inputs or outputs, the I/O registers are unused. An example of a CPLD having I/O cells may be found in co-pending applications U.S. Ser. No. 09/475,879, filed Dec. 30, 1999 and U.S. Ser. No. 09/539,943, filed Mar. 31, 2000, which are each hereby incorporated by reference in their entirety.

Frequently, not all available I/O pins of a device are used. The registers in both the I/O cells configured as combinatorial and the I/O cells of unused pins are effectively wasted. In some configurations (where smaller I/O count packages are used) up to 70% of the I/O cells are unused and significant available register resources are wasted.

A conventional approach to implementing registers of a logic circuit implemented in a CPLD includes: (i) implementing an input (edge of a design) register in an I/O cell, (ii) implementing an output (edge of a design) register in an I/O cell, and (iii) implementing an internal register (inside of a design) in a macrocell.

The term "internal register" as used herein refers to a simple storage element that can be used in general designs and also for pipeline balancing. The internal register does not require an input from combinatorial logic. When a macrocell is used to implement an internal register, the combinatorial logic of the macrocell is not available to the rest of the design.

It would be desirable to have a method and/or architecture where an unused I/O register may be used to implement an internal register when the I/O cell is either unused or configured to provide a combinatorial input and/or output.

SUMMARY OF THE INVENTION

The present invention concerns an I/O cell of a programmable logic device comprising a register, a first multiplexer, a second multiplexer, and a third multiplexer. The first multiplexer may be configured to present one of a plurality of signals to a data input of the register in response to a control signal. The second multiplexer may be configured to select either an output signal from the register or an external input signal in response to the control signal. The third multiplexer may be configured to select one of a number of inputs for presentation as an output signal of the I/O cell in response to the control signal. The register may be configured as an internal register of the programmable logic device when the I/O cell is configured to receive a combinatorial input signal and/or present a combinatorial output signal.

The objects, features and advantages of the present invention include providing a method and/or architecture for input/output cells of CPLDs that may (i) provide a significant benefit in pipelined designs and designs using registers as storage elements, (ii) involve no changes to silicon or architecture, (iii) be implemented as a software upgrade to existing devices, and/or (iv) make up to 19% more registers available to a device for a low silicon cost.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
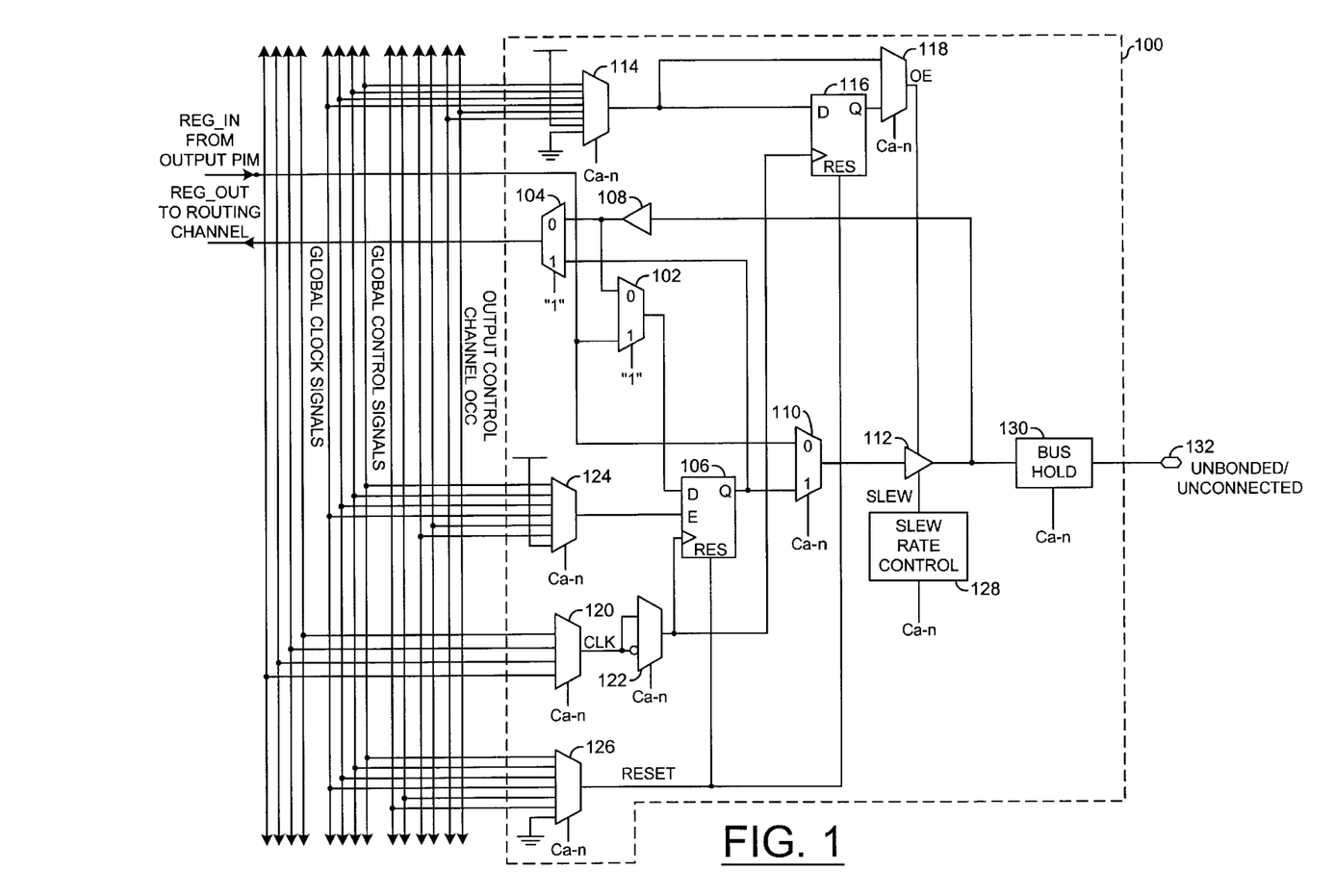
FIG. 1 is a detailed block diagram of an I/O cell illustrating a preferred embodiment of the present invention.

Referring to FIG. 1, a block diagram of an I/O cell 100 is shown. The I/O cell 100 may comprise a multiplexer 102, a multiplexer 104, a register 106, an input buffer 108, a multiplexer 110, an output buffer 112, a multiplexer 114, a register 116, a multiplexer 118, a multiplexer 120, a multiplexer 122, a multiplexer 124, a multiplexer 126, a programmable slew rate control circuit 128, and a programmable bus hold circuit 130. The registers 106 and 116 may be implemented, in one example, as D-type registers. However, other types of registers may be implemented to meet the design criterial of a particular application. The output buffer 112 may be implemented as a tristate buffer. The I/O cell 100 may be implemented similarly to an I/O cell described in co-pending applications U.S. Ser. No. 09/475,879, filed Dec. 30, 1999 and U.S. Ser. No. 09/539,943, filed Mar. 31, 2000, which are each hereby incorporated by reference in their entirety.

When the I/O cell 100 is unbonded or bonded and unused, the register 106 of the I/O cell 100 may be configured to implement an internal register. The multiplexers 102 may have a first input that may receive a signal (e.g., REG_IN), a second input that may receive an external input signal from an output of the buffer 108, and an output that may present a signal to a D-input of the register 106. A control input of the multiplexer 102 may be set to a logic level (e.g., a logic HIGH, or "1") that will select the signal REG_IN as the signal presented to the D-input of the register 106.

The multiplexer 104 may have a first input that may receive a signal from a Q output of the register 106, a second input that may receive the external input signal from the output of the buffer 108, and an output that may present a signal (e.g., REG_OUT) to a routing channel of a CPLD. The multiplexer 104 may be configured to select the signal from the output of the register 106 or the signal from the output of the buffer 108 as the signal REG_OUT in response to a control input. The control input may be set to a logic level (e.g., a logic HIGH, or "1") that will select the signal from the output of the register 106 as the signal REG_OUT.

An output of the register 106 may be connected to a first input of the multiplexer 110. The signal REG_IN may be presented to a second input of the multiplexer 110. The multiplexer 110 may select the signal at the first or second input for presentation at an output in response to a control signal (e.g., Ca-n). The signal Ca-n may be a multi-bit control signal. In one example, an individual bit or group of bits of the signal Ca-n may be used as a control signal. The signal Ca-n may be generated in response to configuration information (e.g., a number of configuration bits) of a programmable logic device. The multiplexer 110 may be configured to respond to one or more bits of the signal Ca-n. The output of the multiplexer 110 may be connected to an input of the output buffer 112. An output of the output buffer 112 may be connected to the I/O pad 132. In one example, the contents of an internal register implemented using the I/O cell 100 may be monitored at the pad 132.

The multiplexer 114 may have a number of inputs that may receive (i) a number of global control signals, a number of signals from an output control channel, a first supply voltage (e.g., VCC), and a second supply voltage (e.g., GND). The multiplexer 114 may have ah output that may present a signal to a D-input of the register 116 and a first input of the multiplexer 118. The register 116 may have an output that may present a signal to a second input of the multiplexer 118. The multiplexer 118 may have an output that may present an enable signal (e.g., OE) to an enable input of the output buffer 112. The multiplexers 114 and 118 may select one of the respective input signals as the respective output signals in response to one or more bits of the signal Ca-n.

The register 116 may be implemented as an OE register. The register 116 may provide compatibility for a synchronous circuit architecture with minimal bus latency memory. An example of a minimal bus latency memory may be found in co-pending patent application U.S. Ser. No. 09/633,514, which is hereby incorporated by reference in its entirety. The output of the I/O cell 100 may be configured, in one example, as always enabled, always disabled, or controlled by the signal OE.

The multiplexer 120 may have a number of inputs that may receive number of global clock signals and an output that may present a clock signal (e.g., CLK) to an inverting input and a non-inverting input of the multiplexer 122. The multiplexer 120 may be configured to select one of the global clock signals as the signal CLK in response to one or more bits of the signal Ca-n. The multiplexer 122 may be configured to select the non-inverted or. inverted polarity of the signal CLK for presentation to a clock input of the registers 106 and 116 in response to one or more bits of the signal Ca-n.

The multiplexer 124 may have a number of inputs that may receive (i) the global control signals, a number of signals from the output control channel, and the supply voltage VCC or GND. The multiplexer 124 may be configured to select one of the input signals for presentation to an enable input of the register 106 in response to one or more bits of the signal Ca-n.

The multiplexer 126 may have a number of inputs that may receive (i) the global control signals, a number of signals from the output control channel, and the supply voltage GND or VCC. The multiplexer 126 may be configured to select one of the input signals as a reset signal (e.g., RESET) that may be presented to a reset input of the registers 106 and 116 in response to one or more bits of the signal Ca-n.

The slew rate control circuit 128 may have an output that may present a signal (e.g., SLEW) to an input of the output buffer 112. The slew rate control circuit 128 may be configured to generate the signal SLEW in response to one or more bits of the signal Ca-n. The output buffer 112 may be configured to operate at different slew rates in response to the signal SLEW.

The bus hold circuit 130 may be configured to present a signal to the pad 132 of the I/O cell 100 in response to one or more bits of the signal Ca-n. The bus hold circuit may be configured to weakly hold a state of the I/O pad 132 when the output buffer 112 is tristated.

Figure 2:
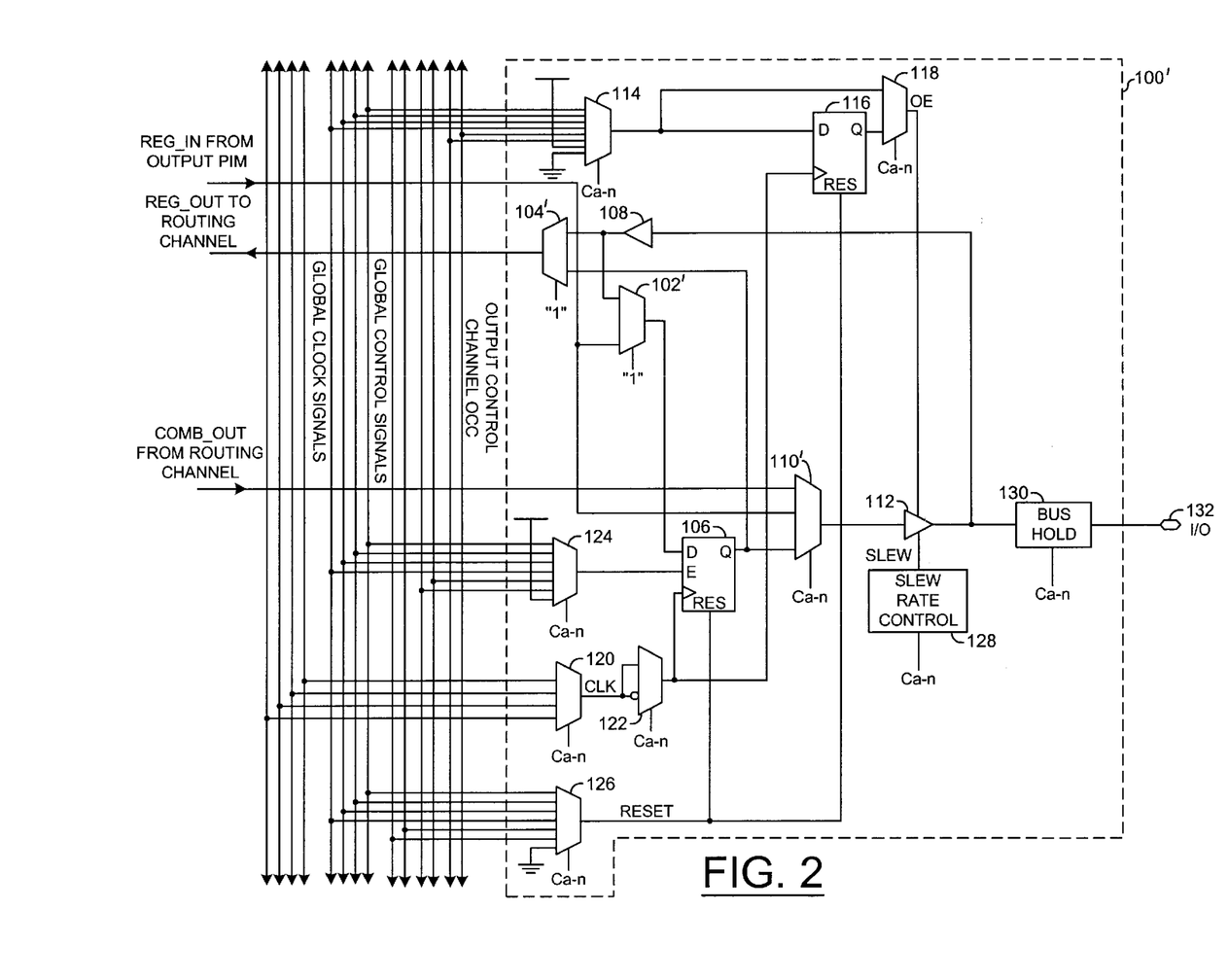
FIG. 2 is a detailed block diagram of an alternative preferred embodiment of the present invention.

Referring to FIG. 2, a block diagram of a circuit 100' is shown in accordance with an alternative preferred embodiment of the present invention. The circuit 100' is generally implemented similarly to the circuit 100 except that a multiplexer 110' may be implemented in place of the multiplexer 110 and the control input of the multiplexers 102' and 104' may be configured to respond to one or more bits of the signal Ca-n. The multiplexer 110' may be implemented, in one example, as a 3:1 multiplexer.

The multiplexer 110' may have a first input that may be connected to an output of the register 106, a second input that may receive the signal REG_IN, and a third input that may receive a signal,(e.g., COMB_OUT). The signal COMB_OUT may be received, in one example, from a routing channel of a CPLD. The multiplexer 110' may be configured to select one of the input signals for presentation at an output in response to one or more bits of the signal; Ca-n. For example, when a combinatorial output is implemented at the same time that the register 106 is used to implement an internal register, the multiplexer 110' may be configured to select the signal COMB_OUT for presentation to an input of the output buffer 112. The multiplexers 102 and 104 may be configured to couple the D-input and the Q output of the register 106 to an output PIM and a routing channel, respectively.

Figure 3:
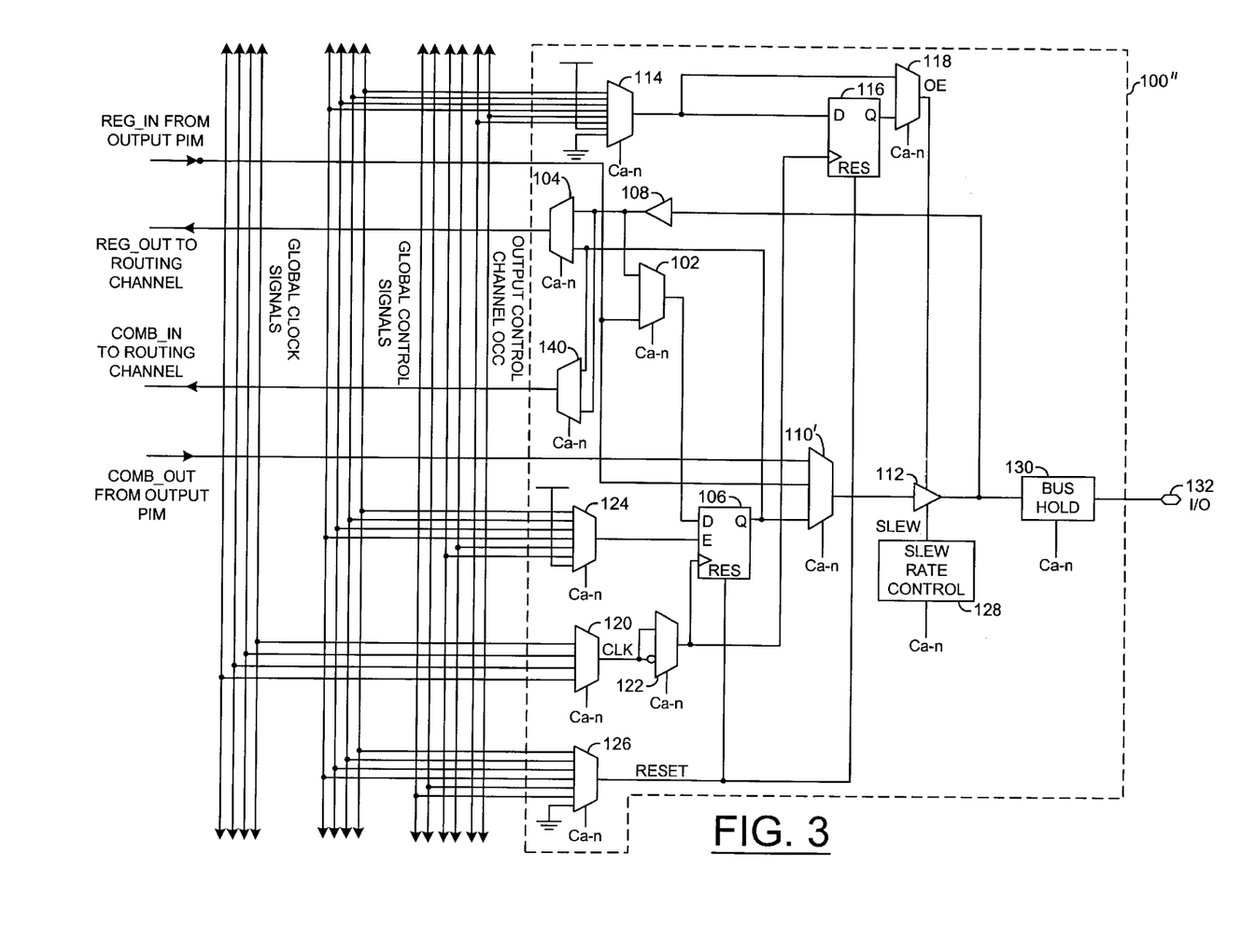
FIG. 3 is a detailed block diagram of another alternative preferred embodiment of the present invention.

Referring to FIG. 3, a detailed block diagram of a circuit 100" is shown in accordance with another alternative embodiment of the present invention. The circuit 100" may be implemented similarly to the circuit 100' except that the circuit 100" may comprise an additional multiplexer 140. The multiplexer 140 may have a first input that may be connected to an output of the register 106 and a second input that may be connected to an output of the input buffer 108. The multiplexer 140 may have an output that may present a signal (e.g., COMB_IN) to a routing channel of a programmable logic device (PLD). The signal COMB_IN may be a combinatorial input signal. The circuit 100" may be configured to implement an internal register in the PLD while at the same time providing a combinatorial input and/or a combinatorial output. Each of the multiplexers 102, 104, and 140 may have a control input that may receive one or more different bits of the signal Ca-n. The multiplexers 102 and 104 may be configured to couple the D-input and Q output of the register 106 to the output PIM and the routing channel, respectively. The multiplexer 110' may be configured to present the signal COMB_OUT to the output buffer 112 in response to one or more bits of the signal Ca-n. The multiplexer 140 may be configured to present an external input signal received from the input buffer 108 to the routing channel as the signal COMB_IN in response to one or more bits of the signal Ca-n.

Figure 4:
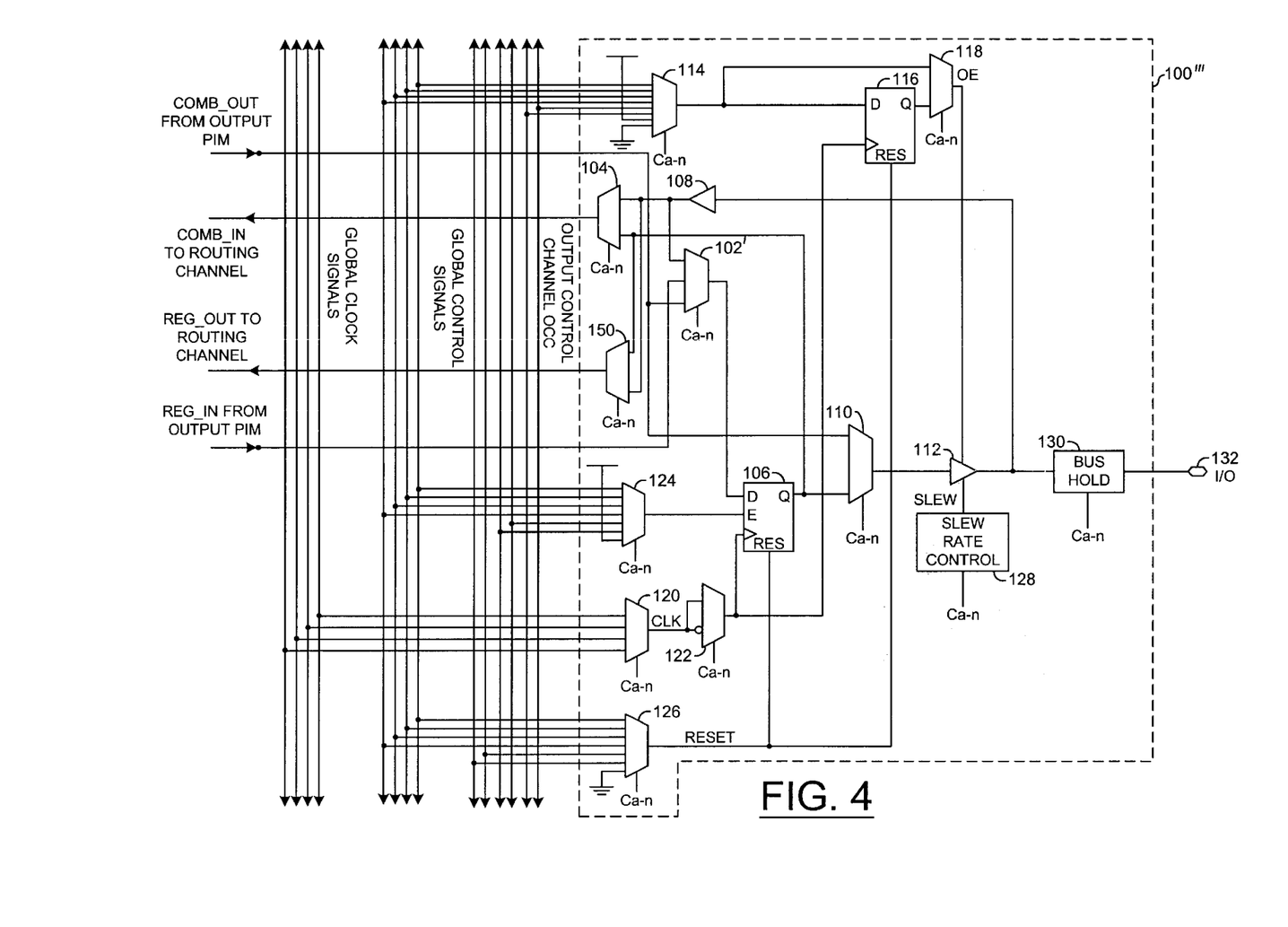
FIG. 4 is a detailed block diagram of yet another alternative preferred embodiment of the present invention.

Referring to FIG. 4, a detailed block diagram of a circuit 100''' is shown illustrating yet another alternative embodiment of the present invention. The circuit 100''' may be implemented similarly to the circuit 100 except that the circuit 100''' may comprise a multiplexer 102' and a multiplexer 150. The multiplexer 102' may be implemented as a 3:1 multiplexer. The multiplexer 102' may have an output that may be connected to a D-input of the register 106, a first input that may be connected to an output of the input buffer 108, a second input that may receive the signal COMB_OUT, and a third input that may receive the signal REG_IN. The multiplexer 150 may be configured to select a signal from either (i) the output of input buffer 108 or (ii) the output of the, register 106 for presentation as a signal REG_OUT in response to one or more bits of the signal Ca-n.

Figure 5:
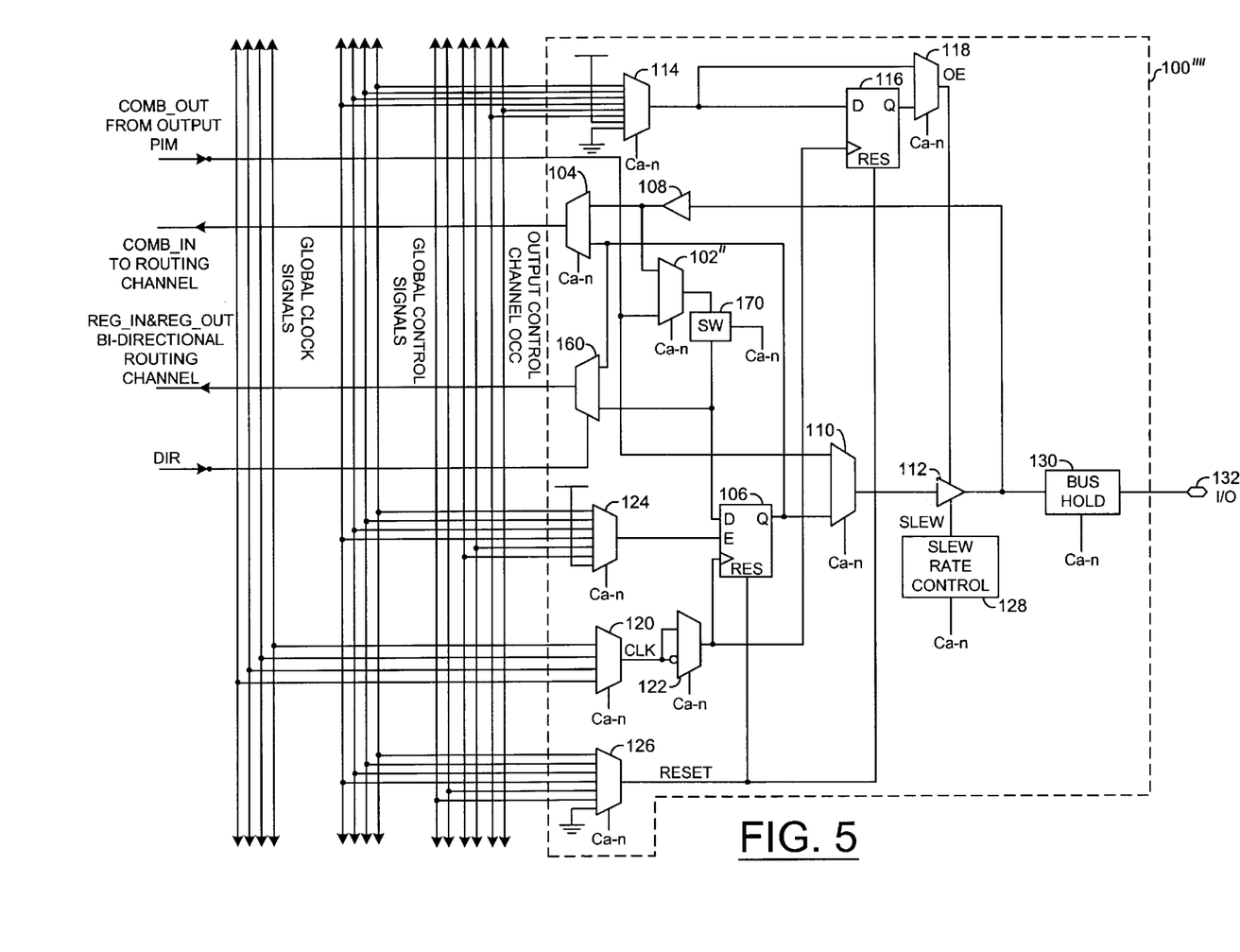
FIG. 5 is a detailed block diagram of yet another alternative preferred embodiment of the present invention.

Referring to FIG. 5, a detailed block diagram of a circuit 100'''' is shown illustrating still another alternative embodiment of the present invention. The circuit 100'''' may be implemented similarly to the circuit 100 except that the circuit 100'''' may include a multiplexer 102'' and a multiplexer 160. The multiplexer 102'' may be implemented similarly to the multiplexer 102 except that the multiplexer 102'' may have a tristatable output that may be connected to the D-input of the register 106. In an alternative implementation, the output of the multiplexer 102'' may be coupled to the D-input of the register 106 via a switch 170. The switch 170 may be configured to connect or disconnect the output of the multiplexer 102'' and the D-input of the register 106 in response to one or more bits of the signal Ca-n.

The multiplexer 160 may be implemented as a bidirectional multiplexer. The multiplexer 160 may have a first terminal that may be connected to the Q output of the register 106, a second terminal that may be connected to the D-input of the register 106, and a third terminal that may be connected to a routing channel. The routing channel may provide a bidirectional connection that may transmit the signals REG_IN and REG_OUT. The multiplexer 160 may have a control input that may receive a control signal (e.g., DIR).

In one mode, the multiplexer 160 may be configured to couple a signal from either the Q output or the D-input of the register 106 to the routing channel connected to the third terminal of the multiplexer 160. In a second mode, the multiplexer 160 may be configured to present a signal from the routing channel to the D-input of the register 160. When a signal is presented from the routing channel to the D-input of the register 160, the output of the multiplexer 102'' may be disconnected from the D-input either by, in one example, tristating the output of the multiplexer 102'' or, in another example, deactivating (opening) the switch 170.

In one example, the present invention may provide 19% more internal registers with a silicon cost of about 2.5% more die area. The present invention may allow access to the I/O register when the I/O cell is in a combinatorial mode. The present invention may provide significant benefit in pipelined designs and designs using registers as storage elements. The present invention may be implemented without changes to the silicon or the architecture. The present invention may be implemented as a software upgrade to existing devices. In one example, a PLD implementing the present invention may have 19% more registers (e.g., 294/1546) available to the device. The extra registers may be very useful for balancing pipelines, required for high performance, or as simple storage elements.

While the invention has been particularly shown and described with reference to the preferred embodiments thereof, it will be understood by those skilled in the art that various changes in form and details may be made without departing from the spirit and scope of the invention.

What is claimed is:

1. An I/O cell of a programmable logic device comprising:
   a register;
   a first multiplexer configured to present one of a plurality of signals to a data input of said register in response to a control signal;
   a second multiplexer configured to select either an output signal from said register or an external input signal in response to said control signal;
   a third multiplexer configured to select one of a number of inputs for presentation as an output signal of said I/O cell in response to said control signal, wherein said register is configurable as an internal register of said programmable logic device when said I/O cell is configured to receive a combinatorial input signal and/or present a combinatorial output signal; and
   a bi-directional multiplexer configured to couple said data input of said register and said output of said register to a routing channel of said programmable logic device, wherein a direction of said bi-directional multiplexer is selected in response to a second control signal.

2. The I/O cell according to claim 1, wherein said first multiplexer comprises a 3:1 multiplexer.

3. The I/O cell according to claim 1, wherein said third multiplexer comprises a 3:1 multiplexer.

4. The I/O cell according to claim 1, wherein said second control signal is received from said routing channel.

5. The I/O cell according to claim 1, wherein said control signal is generated in response to a number of configuration bits of said programmable logic device.

6. The I/O cell according to claim 1, wherein said control signal is a multi-bit control signal.

7. The I/O cell according to claim 6, wherein each of said multiplexers respond to a different one or more bits of said multi-bit control signal.

8. A method for implementing an internal register of a logic design in an I/O cell of a programmable logic device comprising the steps of:
   registering an output signal in an I/O register of an I/O cell having either (i) an unbonded output or (ii) a bonded and unused output; and
   presenting the registered output signal to a routing channel of said programmable logic device with a bi-directional multiplexer controlled in response to a control signal from said routing channel.

9. A method for implementing an internal register of a logic design in an I/O cell of a programmable logic device comprising the steps of:
   (A) presenting a first output signal to a data input of an I/O register;
   (B) presenting a second output signal from said I/O register to a routing channel of said programmable logic device;
   (C) presenting a third output signal at an output of said I/O cell; and/or
   (D) presenting an external input signal to said routing channel, wherein said data input of said I/O register and said output of said I/O register are multiplexed onto a routing channel of said programmable logic device.

10. The method according to claim 9, wherein the step (A) comprises the sub-step of:

multiplexing said first output signal and said external input signal in response to a control signal.

11. The method according to claim 9, wherein the step (A) comprises the sub-step of:

multiplexing said first output signal, said third output signal, and said external input signal in response to a control signal.

12. The method according to claim 9, wherein the step (C) comprises the sub-step of:

multiplexing said second output signal with said third output signal in response to a control signal.

13. The method according to claim 9, wherein the step (C) comprises the sub-step of:

multiplexing said first output signal, said second output signal and said third output signal in response to a control signal.

14. The method according to claim 9, wherein the step (B) comprises the sub-step of:

multiplexing said second output signal and said external input signal in response to a control signal.

15. The method according to claim 9, wherein the step (D) comprises the sub-step of:

multiplexing said second output signal and said external input signal in response to a control signal.

16. The method according to claim 9, wherein said data input of said I/O register and said output of said I/O register are multiplexed with a bi-directional multiplexer controlled in response to a control signal from said routing channel.

17. An I/O cell of a programmable logic device comprising:

a register;

a first multiplexer configured to present one of a plurality of signals to a data input of said register in response to a control signal;

a second multiplexer configured to select either an output signal from said register or an external input signal in response to said control signal;

a third multiplexer configured to select one of a number of inputs for presentation as an output signal of said I/O cell in response to said control signal, wherein said register is configurable as an internal register of said programmable logic device when said I/O cell is configured to receive a combinatorial input signal and/or present a combinatorial output signal; and a fourth multiplexer configured to select either an output of said register or an external input signal in response to said control signal.

18. The I/O cell according to claim 17, further comprising:

a bi-directional multiplexer configured to couple said data input of-said register and said output of said register to a routing channel of said programmable logic device, wherein a direction of said bi-directional multiplexer is selected in response to a second control signal.

* * * * *

UNITED STATES PATENT AND TRADEMARK OFFICE
CERTIFICATE OF CORRECTION

PATENT NO.    : 6,452,417 B1
DATED         : September 17, 2002
INVENTOR(S)   : Micheal T. Moore It is certified that error appears in the above-identified patent and that said Letters Patent is hereby corrected as shown below:

<u>Title page,</u>
Item [56], References Cited, U.S. PATENT DOCUMENTS, insert the following:
-- 4,878,200 A * 10/31/1989   Asghar et al. ............. 365/189.02
5,136,188 A * 8/4/1992       Ha et al. ................. 307/465
5,280,202 A * 1/18/1994      Chan et al. ............... 307/465
5,384,745 A * 1/24/1995      Konishi et al. ............ 365/230.03
5,422,823 A * 6/6/1995       Agrawal et al. ............ 364/489
5,451,887 A * 9/19/1995      El Avat et al. ............ 326/39
5,455,525 A * 10/3/1995      Ho et al. ................. 326/41
5,521,529 A * 5/28/1996      Agrawal et al. ............ 326/41
5,537,057 A * 7/16/1996      Leong et al. .............. 326/41
5,781,030 A * 7/14/1998      Agrawal et al. ............ 326/39
5,799,176 A * 8/25/1998      Kapusta et al. ............ 395/556
5,811,987 A * 9/22/1998      Ashmore, Jr. et al. ....... 326/39
5,818,254 A * 10/6/1998      Agrawal et al. ............ 326/39
5,848,285 A * 12/8/1998      Kapusta et al. ............ 395/800.01
5,966,027 A * 10/12/1999     Kapusta et al. ............ 326/39
6,134,181 A * 10/17/2000     Landry .................... 365/233
6,137,308 A * 10/24/2000     Nayak ..................... 326/39
6,201,407 A * 3/13/2001      Kapusta et al. ............ 326/39 --

Signed and Sealed this

Twenty-fourth Day of December, 2002

JAMES E. ROGAN
*Director of the United States Patent and Trademark Office*